United States Patent
Huang et al.

(10) Patent No.: US 6,661,043 B1
(45) Date of Patent: Dec. 9, 2003

(54) ONE-TRANSISTOR RAM APPROACH FOR HIGH DENSITY MEMORY APPLICATION

(75) Inventors: Kuo-Ching Huang, Kaohsiung (TW); Wen-Cheng Chen, Hsinchu (TW); Wen-Chuan Chiang, Hsin-chu (TW); Kuo-Chuang Tseng, Hsin chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/400,401

(22) Filed: Mar. 27, 2003

(51) Int. Cl.[7] .......................... H01L 21/8242
(52) U.S. Cl. .................. 257/243; 438/244; 438/248; 257/301
(58) Field of Search ................ 438/243–249, 438/386–392; 257/301–305

(56) References Cited

U.S. PATENT DOCUMENTS 6,348,706 B1 * 2/2002 Sandhu
6,486,024 B1 * 11/2002 Tews et al.

* cited by examiner

*Primary Examiner*—Jey Tsai
(74) *Attorney, Agent, or Firm*—George O. Saile; Stephen B. Ackerman (57) ABSTRACT

A new method is provided for the creation of a 1T RAM cell. Standard processing is applied to create STI trenches in the surface of a substrate, $N_2$ implantations are performed into the sidewalls of the STI trenches. A layer of lining oxide is created, the implanted $N_2$ interacts with the lining oxide to form SiON over exposed surfaces of the STI trenches. STI oxide is deposited and polished, filling the STI trenches there-with. Crown patterning is performed to define capacitor areas, the crown patterning stops on a layer of etch stop material and the created SiON and partially removes STI oxide from the STI trenches. Layers of etch stop material, exposed SiON and pad oxide are removed, exposing the surface of the silicon substrate, the etched layers of STI oxide are not affected by this removal. A layer of SAC oxide is grown, n-well and p-well implantations are performed into the surface of the substrate. The layer of SAC oxide is removed, gate oxide is grown, polysilicon is deposited and patterned and etched, forming polysilicon gate material and polysilicon top plate of the capacitor. Standard processing is further applied to complete the 1T-RAM cell by providing gate spacers and impurity implantations for the gate electrode, by saliciding contact surfaces and by providing contacts to the points of contact of the cell.

61 Claims, 6 Drawing Sheets

ONE-TRANSISTOR RAM APPROACH FOR HIGH DENSITY MEMORY APPLICATION

BACKGROUND OF THE INVENTION (1) Field of the Invention

The invention relates to the fabrication of integrated circuit devices, and more particularly, to a method to improve capacitor area efficiency in the creation of one-transistor RAM devices by using a 3-D structured capacitor.

(2) Description of the Prior Art

An important aspect of the creation of Dynamic Random Access Memory (DRAM) devices is the creation of the capacitive storage capability, whereby it is essential that storage node capacitor cell plates be large enough to retain an adequate voltage level without thereby being detrimentally affected by parasitic components of the structure or device noise that may be present during the operation of the device. Device performance improvements continue to be gained by reducing device dimensions, increasing the device density.

Typical DRAM storage cells are created comprising one single Metal-Oxide-Semiconductor Field-Effect-Transistor (MOS-FET) and a single capacitor, this DRAM storage cell is commonly referred to as a 1T-RAM device. The 1T-RAM device stores one bit of data on the capacitor as an electrical charge. Reductions in device dimensions and the therefrom following limitations in available surface area for the creation of the 1T-RAM capacitor create a serious obstacle to increasing the packing density of DRAM devices. The problem of maintaining storage capacity while at the same time decreasing the 1T-RAM device dimensions remain a serious challenge in creating high-density 1T-RAM devices.

Using a two-dimensional stacked capacitor for the creation of a 64 MB DRAM or 1T (planar) RAM cells, having a relatively small memory cell area does not allow for the creation of the required capacitive storage capability. To address this problem, stacked capacitors have been proposed that make use of a three-dimensional structure in order to improve storage capacity. Variations of the stacked capacitor are for instance double stack, fin-structured, cylindrical, spread stacked and box structured capacitors.

In more recent applications, the planar capacitor has found increased use since the planar capacitor offers the advantage of being fully compatible in its creation with conventional logic device creation processes. The 1-T RAM cell size is however difficult to reduce when using the planar capacitor. A number of solutions have been suggested for this problem, the invention provides such a solution that allows for the use of a planar capacitor without requiring a large amount of surface area for the there-with created 1T-RAM cell.

U.S. Pat. No. 5,918,148 (Sato) shows a one transistor (1T) SRAM process.

U.S. Pat. No. 5,434,438 (Kuo) shows a one transistor and one capacitor memory device.

U.S. Pat. No. 6,165,828 (Forbes) shows a process for a gated lateral transistor.

U.S. Pat. No. 6,143,636 (Forbes) discusses a flash memory process.

Leung, et al., "The ideal SoC Memory: 1T SRAM", 0-7803-6598 4/00, IEEE pp. 32 to 36.

SUMMARY OF THE INVENTION

A principle objective of the invention is to provide a method that allows for the creation of a one-transistor DRAM device whereby emphasis is placed on improved capacitor area efficiency of the design.

In accordance with the objectives of the invention a new method is provided for the creation of a 1T RAM cell. Standard processing is applied to create STI trenches in the surface of a substrate, $N_2$ implantations are performed into the sidewalls of the STI trenches. A layer of lining oxide is created, the implanted $N_2$ interacts with the lining oxide to form SiON over exposed surfaces of the STI trenches. STI oxide is deposited and polished, filling the STI trenches there-with. Crown patterning is performed to define capacitor areas, the crown patterning stops on a layer of etch stop material and the created SiON and partially removes STI oxide from the STI trenches. Layers of etch stop material, exposed SiON and pad oxide are removed, exposing the surface of the silicon substrate, the etched layers of STI oxide are not affected by this removal. A layer of SAC oxide is grown, n-well and p-well implantations are performed into the surface of the substrate. The layer of SAC oxide is removed, gate oxide is grown, polysilicon is deposited and patterned and etched, forming polysilicon gate material and polysilicon top plate of the capacitor. Standard processing is further applied to complete the 1T-RAM cell by providing gate spacers and impurity implantations for the gate electrode, by saliciding contact surfaces and by providing contacts to the points of contact of the cell.

BRIEF DESCRIPTION OF THE DRAWINGS

FIGS. 1 through 9 address the first embodiment of the invention.

FIGS. 10 through 17 address the second embodiment of the invention, wherein the implant of nitride, FIG. 2, is replaced by first growing a layer of liner oxide over which a thin layer of nitride is deposited, FIG. 11. Remaining processing steps essentially follow the processing steps of the first embodiment of the invention.

DESCRIPTION OF THE PREFERRED EMBODIMENTS

A one-transistor RAM structure has been widely applied in applications of less-dense memory size using embedded DRAM devices. The cell size for these applications is not as critically small as for denser memory cells using embedded DRAM devices due to the relatively large surface area that is required by the capacitor area. For denser memory size applications, a competitive cell size is required when compared with the creation of denser memory cells. The invention addresses this concern and provides a method that allows for utilizing a three-dimensional capacitor structure.

The invention will be described by describing two embodiments of the invention.

A first embodiment of the invention will be described using FIGS. 1 through 9 for this purpose.

Figure 1:
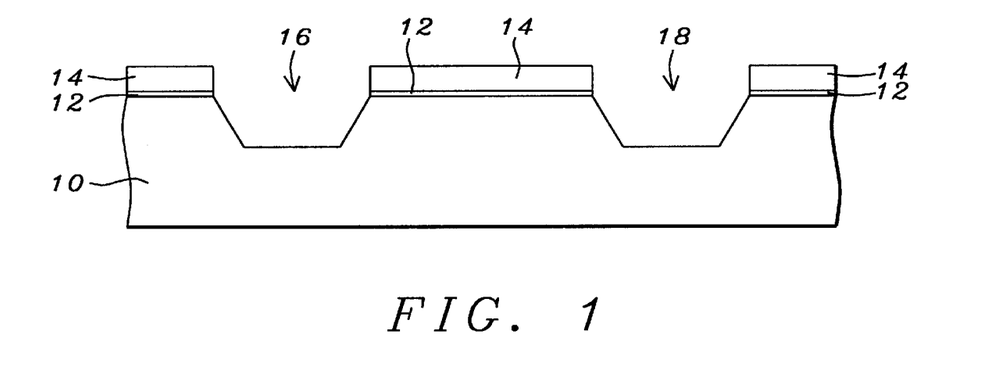
FIG. 1 shows a cross section of the surface of a semiconductor substrate over the surface of which have been created first a layer of pad oxide over which second is created a layer if nitride. STI trenches have been etched into the surface of the substrate.

Referring now specifically to the cross section that is shown in FIG. 1, this cross section comprises the following:

10, the surface of a silicon semiconductor substrate 12, a layer of pad oxide grown over the surface of substrate 10

14, a layer of silicon nitride created over the surface of the layer 12 of pad oxide 16 and 18, STI trenches etched into the surface of the substrate 10.

Substrate 10 is a conventional silicon monocrystalline semiconductor substrate, the growing of the layer 12 of pad oxide over the surface thereof can be a silicon dioxide material but may be a composite oxide, such as TEOS and silicon dioxide, or a nitride oxide layer or a like gate dielectric. The pad oxide 12 can be silicon dioxide, thermally grown in an oxygen-steam ambient at a temperature between 800 and 1,000 degrees C. to a thickness of about 30 to 300 Angstrom. Alternatively, other methods of oxidation can be used for the creation of layer 12 of pad oxide, such as oxidation in a dry oxygen and anhydrous hydrogen chloride in an atmospheric or low pressure environment, or in a low temperature, high pressure environment and the like.

The layer 14 of silicon nitride ($Si_3N_4$) can be deposited using LPCVD or PECVD procedures at a pressure between about 300 mTorr and 400 mTorr, at a temperature between about 600 and 800 degrees C., to a thickness of about 2,500 Angstrom using $NH_3$ and $SiH_4$. The silicon nitride layer 14 can also be deposited using LPCVD or PECVD procedures using a reactant gas mixture such as dichlorosilane ($SiCl_2H_2$) and ammonia ($NH_3$).

STI trenches 16 and 18 are created using a conventional process if STI formation.

One conventional approach in forming STI regions in the surface of a substrate is to deposit silicon nitride (layer 14) on thermally grown oxide (layer 12). After deposition of the nitride, a shallow trench is etched into the substrate using a mask. A layer of STI oxide is then conventionally deposited into the trench so that the trench forms an area of insulation dielectric, which acts to isolate the devices in a chip and thus reduce the cross talk between active devices. The excess deposited oxide is conventionally polished off and the trench planarized to prepare for the next level of metallization. The silicon nitride is provided to the silicon to prevent polishing of the masked silicon oxide of the device.

The process of creating the STI openings is typically performed mainly by plasma etching. Basically, in plasma etching as used in the manufacturing of silicon integrated devices a silicon wafer, on whose surface have been deposited various layers, is positioned on a first electrode in a processing chamber that also includes a second electrode spaced opposite the first. As a gaseous medium that consists of one or more gasses is flowed through the chamber, an r-f voltage, which may include components of different frequencies, is applied between the two electrodes of the processing chamber to create a discharge that ionizes the gaseous medium and that forms a plasma that etches the wafer. By appropriate choice of the gasses of the gaseous medium and of the parameters of the discharge, selective and anisotropic etching is achieved. In most modern processes, a dry etch is performed wherein the wafer is exposed to a plasma, formed in the flow of one or more gasses. Typically, one or more halogenated compounds are used as an etchant gas. For example, $CF_4$, $CHF_3$ (Freon 23) $SF_6$ or $NF_3$ can be used. Added can be gases such as $O_2$, Ar and $N_2$.

Figure 2:
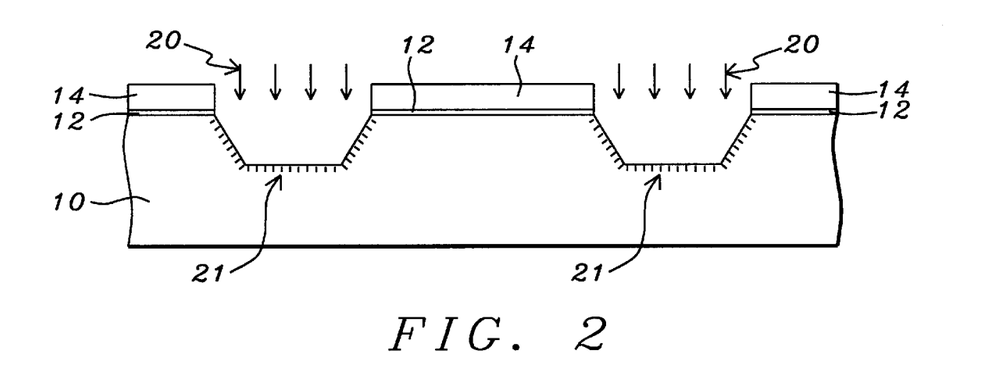
FIG. 2 shows a cross section during $N_2$ implant into the exposed surfaces of the STI trenches.

The cross section of FIG. 2 shows the process of $N_2$ implant 20 into the exposed surfaces of the STI trenches 16 and 18, creating high concentrations 21 of $N_2$ in the exposed surfaces of the STI trenches 16 and 18.

The source of nitrogen for the exposure 20 may be a nitrogen containing gas that is generated by a number of sources. For instance, one of the following sources may be used: helical generator, helicon, electron-cyclotron resonance or inductively coupled. During the treatment 20, the substrate 10 may be unbiased, in which case the ionized substances are accelerated by the implantation 20 potential, which is typically in the order of 20 Volts, after which the $N_2$ substances are implanted into the exposed surfaces of trenches 16 and 18. For further acceleration of the ions of the $N_2$ implant 20, the substrate may be biased, using either a DC or a RF bias.

Implant 20 may be a selective implant for which a mask (not shown) is applied. By however controlling the thickness of layer 14 of silicon nitride, the patterned and etched layer 14 of silicon nitride may serve as a mask for the $N_2$ implant 20.

The nitride implant 20 preferably uses a nitride ion density of between about 20 to 100 KeV and a dose between about 1E10 to 1E14 atoms/$cm^3$.

Figure 3:
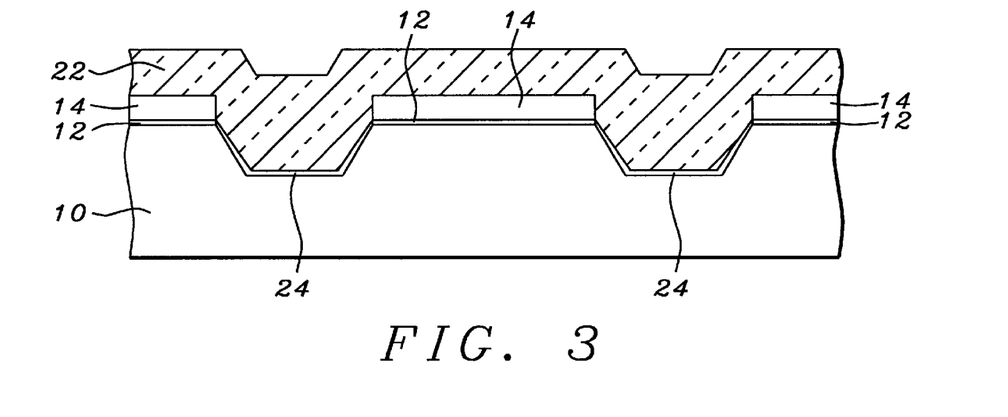
FIG. 3 shows a cross section after providing lining oxide, creating a thin layer of SiON over the exposed surfaces of the STI trenches, in addition STI oxide has been deposited.

The cross section of FIG. 3 shows the completion of the creation of lining oxide 24 after which layer 22 of STI oxide is deposited.

Conventional methods of oxidation may be applied for the creation of the lining oxide 24. For instance, the wafer may be placed in an oxidation environment, generally in steam at a high temperature such as 1,100 degrees C. The portions of the wafer not covered by the oxidation barrier oxidize to form thermal silicon thereat, oxidation of the silicon surface is masked by the oxidation barrier.

It must be noted that the lining oxide 24 provided will interact with the created high concentration 21 of $N_2$, FIG. 2, converting the lining oxide into layers 24 SiON over the surfaces of the STI trenches 16 and 18.

Layer 22 of STI oxide can be created with a chemical vapor deposition (CVD) of silicon dioxide ($SiO_2$), filling the trenches 16 and 18, with the STI oxide further overlying layer 14 of silicon nitride. Layer 22 of silicon dioxide can be deposited by PECVD, PECVD is preferred because of the low deposition temperature. PECVD silicon dioxide may be deposited at temperatures between 200 and 350 degrees C. for $SiH_4/O_2$ or $SiH_4/N_2O$ precursors. The silicon oxide layer is deposited to a thickness of about 3,000 Angstrom.

Figure 4:
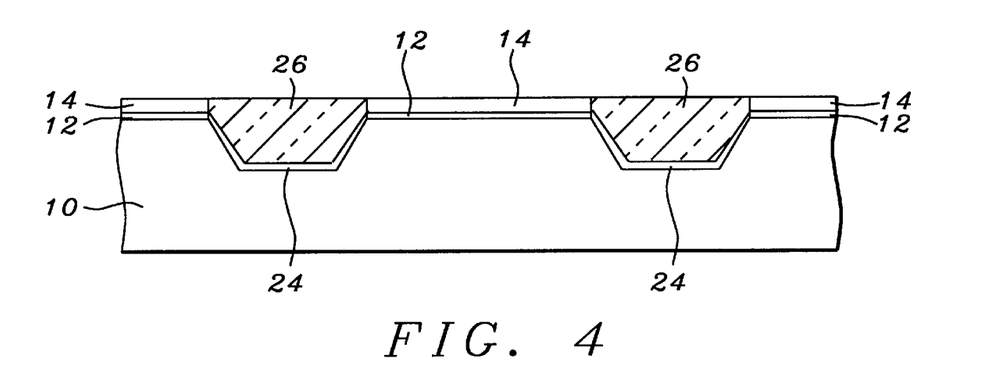
FIG. 4 shows a cross section after the deposited layer of STI oxide has been planarized down to the surface of the layer of etch stop material, the layer of etch stop material has been used of stop for the planarization, reducing the height of the layer of etch stop by an amount.

The layer 22 of STI oxide is than planarized, FIG. 4, using for instance methods of Chemical Mechanical Polishing (CMP) for this purpose. An etchback can also be applied for this purpose, layer 22 of silicon oxide can be etched by RIE or anisotropic plasma etching by using an etchant containing fluorocarbons, for example $CF_4$ or $CHF_3$. Layers 26 of STI oxide remain in place inside the trenches 16 and 18 and overlying layers 24 of SiON after the planarization or etch of layer 22.

The removal of layer 22 of STI oxide from the surface of layer 14 of silicon nitride has resulted in reducing the height of the latter layer 14 by an amount, as is apparent when comparing the height of layer 14 shown in the cross sections of FIGS. 3 and 4.

Figure 5:
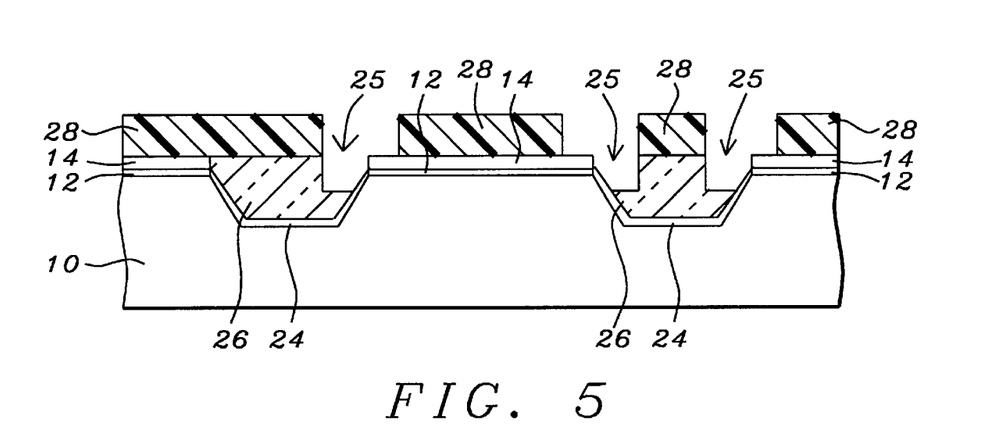
FIG. 5 shows a cross section after crown patterning and etching, the etch stopping at the layer of etch stop material and on the layer of SiON created over sidewalls of the STI trench, preventing damage to the sidewalls of the STI trench. Capacitor areas are defined in this manner.

A photoresist mask 28, FIG. 5, is next created over the surface of substrate 10. The openings 25 provided in the layer 28 of photoresist define capacitor areas over the surface of substrate 10. Photoresist mask 28, FIG. 5, can be created, using conventional methods of photoresist coating followed by exposure and development of the coated layer of photoresist. It must be noted in the cross section that is shown in FIG. 5 that the etch of the layers 26 of STI oxide stops on the surface of layer 14, FIG. 5, of etch stop material and on the surface of layer 24 of SiON. Layer 24 of SiON has a similar etch rate and etch selectivity with respect to STI oxide 26 as layer 14 of silicon nitride.

During this crown etch the layer 14 of nitride protects the surface of the substrate 10 from any damage or rounding of the corners of the STI trenches 16 and 18 around the upper perimeter of these trenches. The thin layer 24 of SiON equally protects the sidewalls of trenches 16 and 18 and further enhances Vt performance of the thereover created capacitor.

The advantages that are provided during the crown etch of the STI oxide contained in trenches 16 and 18, advantages that are provided by the presence of the layer 24 of SiON during this crown etch, are:

The sidewalls of trenches 16 and 18 are protected during the crown etch and will therefore not be damaged by the crown etch, and The crown etch is provided with adequate control so that improved control can be exercised in establishing an optimum or improved profile of the remaining layers of STI oxide in trenches 16 and 18; this optimum profile is specifically achieved in the corners where the remaining STI oxide intersects with the sidewalls of the trenches 16 and 18.

From these stated advantages, the following operational advantages are derived for a thereover created capacitor:

lower node junction leakage, and higher field isolation strength.

Figure 6:
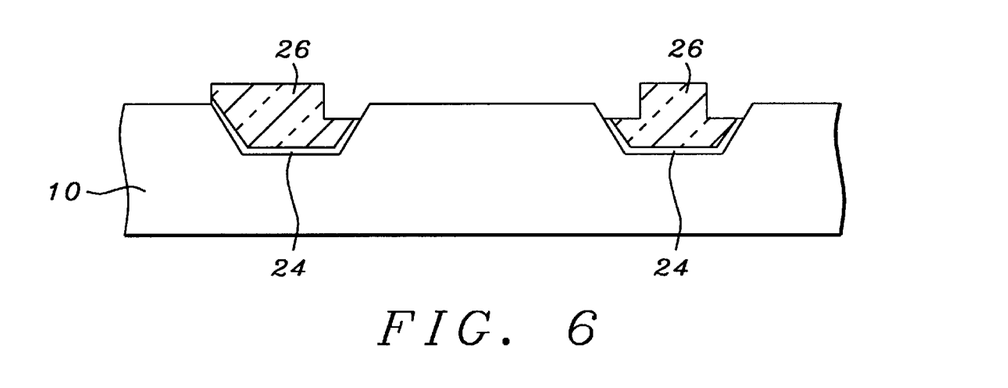
FIG. 6 shows a cross section after the photoresist mask has been removed, the etch stop has been removed as have been the pad oxide and the exposed SiON over the sidewalls of the STI trenches, exposing the substrate.

FIG. 6 shows a cross section after the photoresist mask 28 has been removed from the surface of substrate 10, the etch stop layer 14 of silicon nitride has been removed, the layer 12 of pad oxide has been removed as has the layer 24 of SiON where this layer is exposed over the sidewalls of the STI trenches 16 and 18.

The layer 14 of nitride can be etched by first creating a first etch blocking mask of photoresist (not shown) that exposes the surface of layer 14 and then anisotropically etching the exposed layer 14 of nitride with a silicon nitride etch recipe comprising $CHF_3$ at a flow rate between about 0 and 100 sccm, $CF_4$ at between about 0 and 50 sccm and Ar at between about 50 and 150 sccm.

The layer 12 of pad oxide can be removed, using the same first etch blocking mask as is used for the removal of the layer 14 of nitride, by applying for instance reactive ion etching (RIE) using $Ar/CF_4$ as an etchant at a temperature of between about 120 and 160 degrees C., a pressure of between about 0.30 and 0.40 Torr for a time of between about 33 and 39 seconds. Pad oxide layer 12 can also be etched using BEO, the BOE may comprise a mixed solution of fluoroammonium and fluorohydrogen (7:1) and phosphoric acid solution.

After layers 14 and 12 have been removed, the first etch blocking mask is removed.

The exposed layer 24 of SiON can be removed using a second etch blocking mask by, for example, applying a solution of ammonia and hydrogen peroxide ($NH_4OH+H_2O_2$) with an etch rate of between about 300 to 900 Angstrom per minute.

It is preferred to apply a thorough surface rinse and wash after the cross section shown in FIG. 6 has been created.

Figure 7:
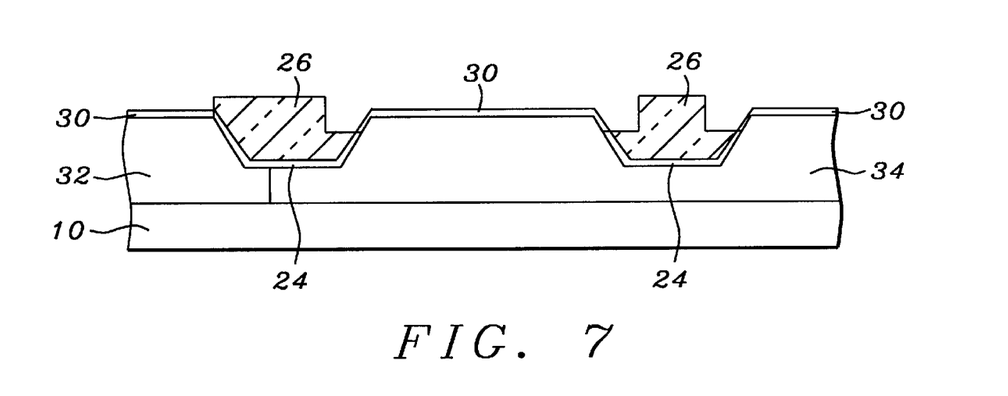
FIG. 7 shows a cross section after a layer of SAC oxide has been deposited (for protection of the substrate surface during subsequent impurity implants), n-well and p-well implants have been performed into the surface of the substrate.

Next, FIG. 7, a layer 30 of sacrificial oxide is grown over the exposed surfaces, this layer 30 of SAC oxide is provided to protect the surface of substrate 10 during subsequent impurity implants into the surface thereof.

The layer 30 of sacrificial oxide can be created using the following processing conditions: source: wet $O_2$, flow rate for the $O_2$ is about 0 to 10 sccm, flow rate for the $H_2$ is about 15 slpm, temperature of about 875 degrees C., under atmospheric pressure, time of about 30 minutes, a furnace is used due to the thermal oxide.

The layer 30 of sacrificial oxide can also be grown over the surface of the substrate 10 using LPCVD, PECVD, or APCVD processing, in a steam oxygen ambient, at a temperature between about 400 to 800 degrees C.

Well implants 32 and 34, of either p-type of n-type impurity implantations, are next performed into the surface of substrate 10.

The type of impurity that is used for the impurity implants 32/34 is determined by the type of well that is to be created in the surface of substrate 10 over which a capacitor and a 1T-RAM cell is to be created.

A typical n-well implantation can be performed using arsenic or phosphorous with an energy within the range of between 300 to 600 KeV and a dose within the range of between 1E13 to 5E14 atoms/$cm^3$, p-well ion implantations is preferred to use indium or boron with an energy within the range of between 50 to 400 KeV and a dose within the range of between 1E12 to 5E13 atoms/$cm^3$.

With the formation of the patterned and etched layers 26 of STI oxide, extended capacitor surface has been provided, the walls of the pattern that has been etched into the STI oxide is used to increase capacitor surface areas and therewith capacitive storage capability.

After p/n-well impurity implants have been performed, the layer 30 of SAC oxide is no longer required and is therefore removed.

Figure 8:
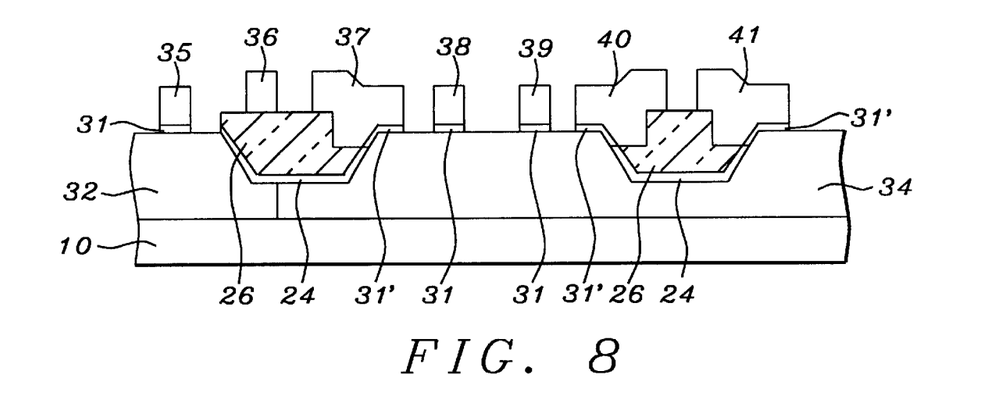
FIG. 8 shows a cross section after the layer of SAC oxide has been removed, gate oxide has been grown, a layer of polysilicon has been deposited, patterned and etched, creating layers of gate electrode material and layers of a top plate for the to be created capacitors.
Figure 9:
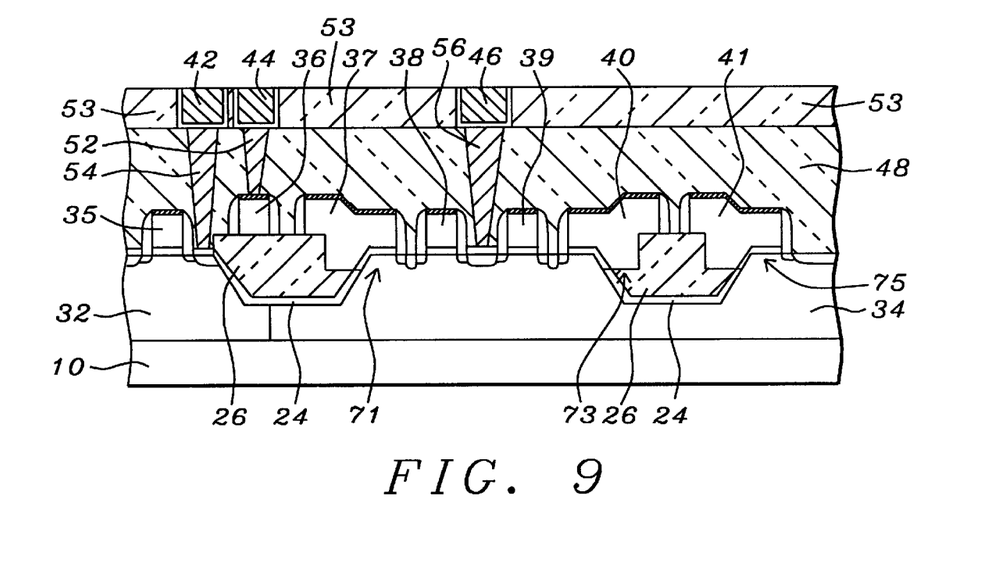
FIG. 9 shows a cross section after processing has been performed for the completion of the 1-T RAM cell.

The remaining processing steps, as shown in FIGS. 8 and 9, complete the formation of the capacitors and gate electrode structures. For this purpose, a layer of gate material, preferably comprising polysilicon, is deposited over the surface shown in cross section in FIG. 7. This layer of gate material is patterned and etched, resulting in the cross section that is shown in FIG. 8, wherein specifically:

layers 31 of gate oxide for the thereover to be created gate electrodes; where the layer of gate oxide serves as a dielectric layer of the to be created capacitors these layers have been highlighted as layer 31' for purposes of differentiation over the n/p-well 32, a layer 35 of gate material has been created over the left-most STI region 26 a layer 36 of gate material has been created, serving as the basis for a word-line 37, 40 and 41 are patterned and etched layer of gate material, preferably comprising polysilicon, for capacitor top plate for three capacitors created over the surface of substrate 10 first capacitor; layers 31' form the capacitor dielectric layers, the substrate 10 functions as the capacitor bottom plate 38 and 39, layers of gate material overlying the layers 31 of gate oxide, these two gate structures will serve as bit-line support gates.

The 1T-RAM is then completed as shown in the cross section of FIG. 9, wherein are highlighted:

48, a first layer of dielectric 50, a second layer of dielectric 52, a conductive interconnect to gate electrode 36

54, a conductive interconnect to the drain region of gate electrode 35

56, a conductive interconnect to the drain region of gate structures 38 and 39

42, 44 and 47, conductive interconnects to the underlying conductive interconnects 54, 52 and 56

43, 45, 47, barrier and or seed layers for conductive interconnects 42, 44 and 47

71, 73 and 75, three capacitors created by the invention; of these capacitors, the substrate 10 serves as the first plate of the capacitors, the layers 31' of gate oxide form the capacitor dielectric while the salicided layers 37, 40 and 41 form the second plate of the capacitors.

Not highlighted in the cross section of FIG. 9 are gate electrode elements which are shown such as source/drain region impurity implants and gate spacers form over sidewalls of created gate structures and, notably, over sidewalls of the created capacitors 71, 73 and 75. In addition, salicidation has been provided to the contact surfaces of the active elements that are shown in the cross section of FIG. 9, these layers of salicided material are shown but, in order to avoid making the cross section of FIG. 9, too crowded with references, not highlighted. As salicided surfaces are shown layers overlying structures 35, 36, 38, 39, the drains region of gate electrode 35, the drain region of the gate electrode pair 38/39 and the three capacitors 71, 73 and 75.

From the cross section that is shown in FIG. 9, it is clear that contact point 44 serves as a word-line (or top plate) contact of the created RAM cell while contact point 46 serves as the bit-line for the created DRAM cell. It is now also more clear that implant 34 creates a cell-well while implant 32 creates a n/p-well.

The second embodiment of the instant invention is highlighted using FIG. 10 through 17. A number of the processing steps that are provided by the second embodiment of the invention are identical to steps that are provided under the first embodiment of the invention, for this reason the second embodiment of the invention can be explained in considerably abbreviated form.

Figure 10:
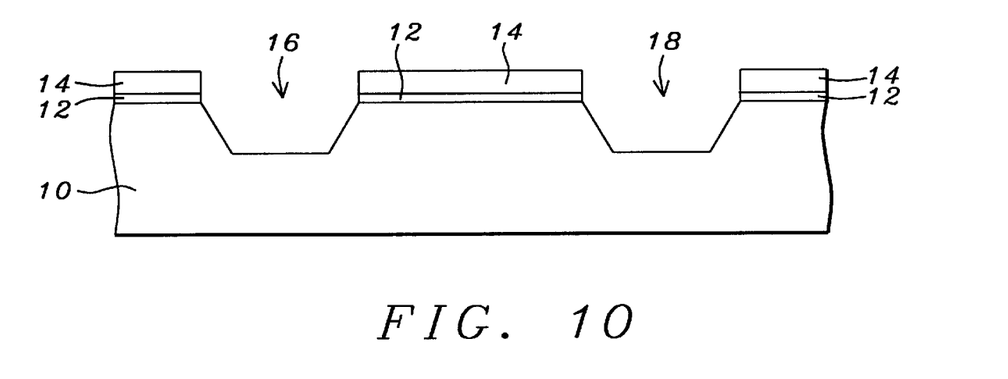
Figure 11:
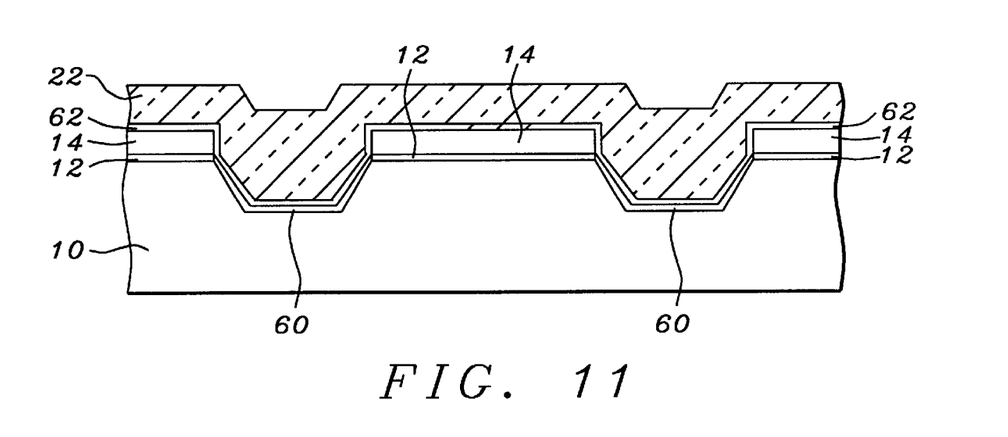
Figure 12:
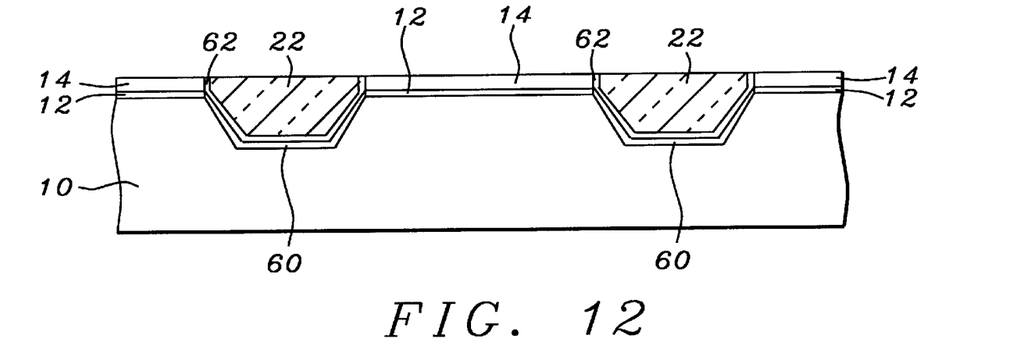
Figure 13:
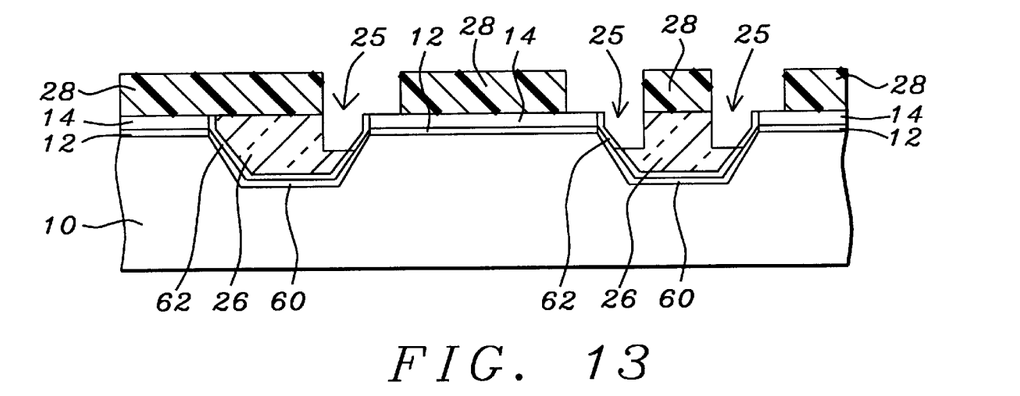
Figure 14:
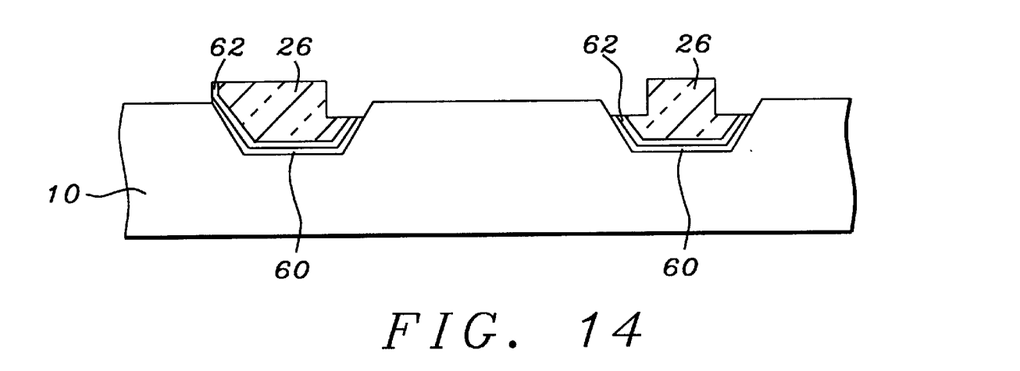
Figure 15:
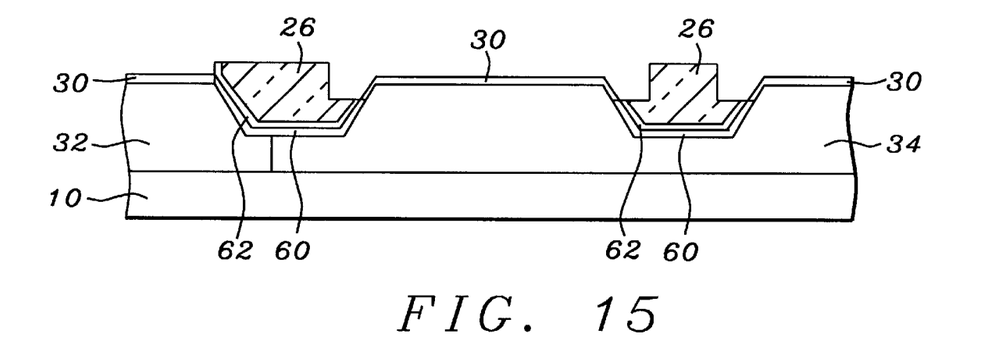
Figure 16:
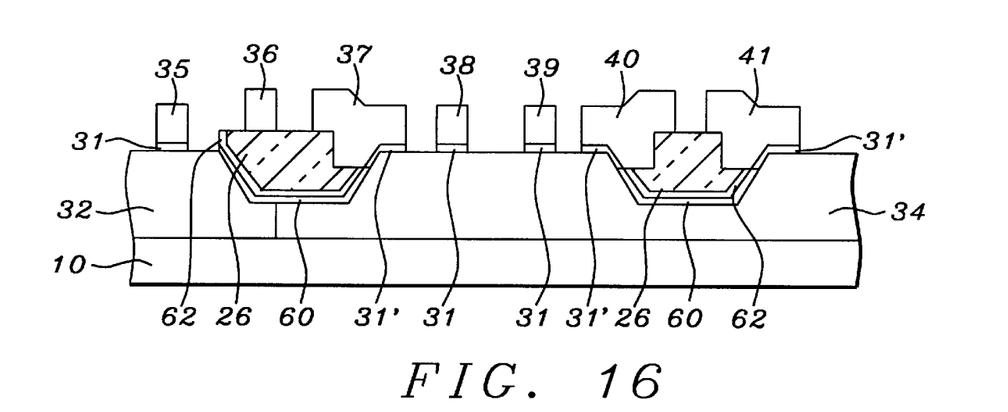
Figure 17:
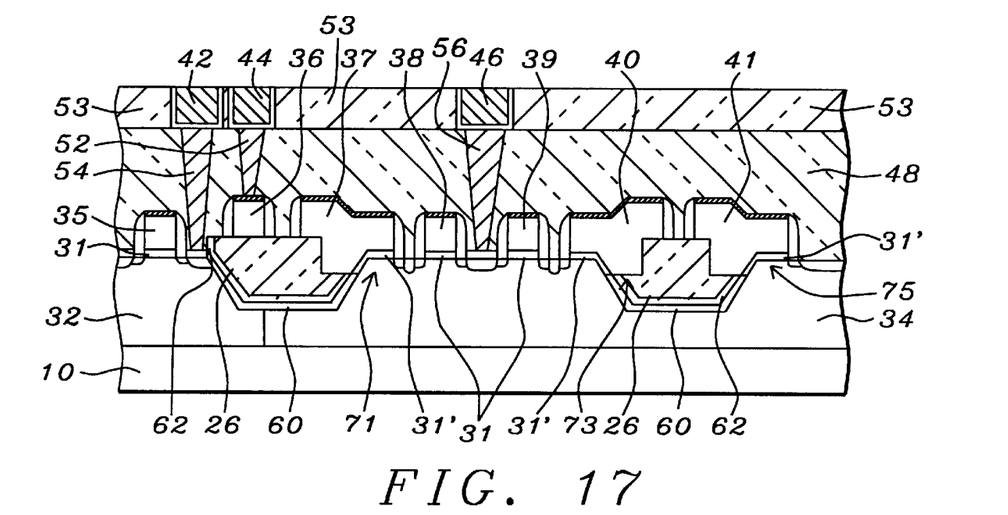

It will be recognized that the cross section shown in FIG. 10 is identical to the cross section that is shown in FIG. 1. FIG. 11 is ate significant variance with the first embodiment of the invention and shows a layer 60 of liner oxide grown over exposed surface of substrate 10, a thin layer 62 of silicon nitride has been deposited over the surface of the structure including over the surface of the created layer 60 of liner oxide. Layers 60 and 62 are, under the second embodiment of the invention, provided for purposes of etch stop and surface protection that under the first embodiment of the invention have been provided by the layer 24, FIG. 3, of SiON.

The growing of the layer 60 of liner oxide over the exposed surface of the substrate 10 can be performed using methods as previously highlighted for the creation of a layer of pad oxide. That is layer 60 may be a silicon dioxide material but may be a composite oxide, such as TEOS and silicon dioxide, or a nitride oxide layer or a like gate dielectric. The liner oxide 60 can be silicon dioxide, thermally grown in an oxygen-steam ambient at a temperature between 800 and 1,000 degrees C. to a thickness of about 30 to 300 Angstrom. Alternatively, other methods of oxidation can be used for the creation of layer 60 of liner oxide, such as oxidation in a dry oxygen and anhydrous hydrogen chloride in an atmospheric or low pressure environment, or in a low temperature, high pressure environment and the like.

FIG. 11 further shows a layer 62, of silicon nitride. This layer 62 of silicon nitride ($Si_3N_4$) can be deposited using LPCVD or PECVD procedures at a pressure between about 300 mTorr and 400 mTorr, at a temperature between about 600 and 800 degrees C., to a thickness between about 300 and 600 Angstrom using $NH_3$ and $SiH_4$. The silicon nitride layer 62 can also be deposited using LPCVD or PECVD procedures using a reactant gas mixture such as dichlorosilane ($SiCl_2H_2$) and ammonia ($NH_3$).

It is readily acceptable that the function and advantages that are for the first embodiment of the invention are provided by layer 24 of FIGS. 3–9, are, for the second embodiment of the invention, replaced and provided by layers 60 and 62.

FIGS. 12 through 17 will be recognized as being similar to the cross sections that are shown in FIGS. 4 through 9, with however in the cross sections of FIGS. 12 through 17 layers 60 being a layer of liner oxide while layer 62 is the thin layer of silicon nitride.

In view of the similarity between the processing steps that are applied under the second embodiment of the invention and corresponding processing steps of the first embodiment of the invention, a detailed description of these remaining processing steps for the second embodiment of the invention would only lead to considerable amount of repetition, which at this time is elected to be avoided. It is believed that, keeping in mind the created layers 60 of liner oxide and 62 of silicon nitride, that the processing steps that are further highlighted with the cross sections that are shown in FIGS. 11 through 17, are clear without further explanation.

The invention provides for:

1. Avoiding substrate damage during crown etching for the creation of trenches that align with previously created STI trenches
2. Improved uniformity and integrity of the capacitor dielectric overlying the sidewalls of the trenches created for the purpose of creating a capacitor over the surface thereof
3. The size of the created capacitor does not compromise the cell of the RAM cell in which the capacitor is used
4. The process of creating a capacitor of compatible with conventional logic process techniques
5. The capacitor that is created can be scaled
6. The creation of the capacitor requires only one additional mask, that is the mask that is used for the crown etch of etching of the trenches for the capacitor within previously created STI trenches.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for the creation of a 1T RAM cell, comprising the steps of:

providing a substrate, a layer of pad oxide having been provided over the substrate, a first layer of etch stop material having been provided over the pad oxide;

etching at least one trench having a first surface area through the first layer of etch stop material, through the layer of pad oxide and into the surface of the substrate;

creating a second layer of etch stop material over surfaces of the at least one trench;

filling the at least one trench with a layer of insulation material to a level of the surface of the first layer of etch stop material;

removing the layer of insulation material to a depth over a second surface area being smaller than the first surface area, creating a third surface area of the layer of insulation material above which the layer of insulating material has been removed being larger than the second surface area, exposing the second layer of etch stop material;

removing the layers of first etch stop material, pad oxide and the exposed second layer of etch stop material;

creating a layer of capacitor dielectric over the third surface area of the layer of insulating material and extending adjacent thereto; and creating a layer of capacitor material over the layer of capacitor dielectric material.

2. The method of claim 1, further saliciding the surface of the layer of capacitor material.

3. The method of claim 1 wherein the first layer of etch stop material comprises silicon nitride.

4. The method of claim 1 wherein creating a second layer of etch stop material comprises performing a nitride implant into exposed surfaces of the at least one trench followed by creating a layer of liner oxide over the surface thereof.

5. The method of claim 1 wherein creating a second layer of etch stop material comprises first creating a layer of liner oxide over exposed surfaces of the at least one trench followed by second depositing a layer if silicon nitride over the layer of liner oxide.

6. The method of claim 1 wherein the insulation material comprises Shallow Trench Isolation oxide.

7. The method of claim 1 wherein the layer of capacitor dielectric comprises gate oxide.

8. The method of claim 1 wherein the layer of capacitor material comprises polysilicon.

9. A method for the creation of a 1T RAM cell, comprising the steps of:

providing a substrate;

growing a layer of pad oxide over the surface of the substrate;

depositing a first layer of etch stop material over the layer of pad oxide;

etching at least one trench having a first surface are through the first layer of etch stop material, through the layer of pad oxide and into the surface of the substrate;

performing an $N_2$ impurity implant into exposed surfaces of the at least one trench;

growing a layer of liner oxide over exposed surfaces of the at least one trench, creating a second layer of etch stop material over exposed surfaces of the at least one trench;

depositing a layer of insulating material over the surface of the first layer of etch stop material, including the surface of the layer of liner oxide;

planarizing the layer of insulating material to about the surface of the first layer of etch stop material, creating at least one layer of insulating material having a first surface area;

providing a crown etch mask over the surface of the first layer of insulating material, including the surface of the at least one layer of insulating material, exposing the at least one layer of insulating material over a second surface area being smaller than the first surface area;

etching the at least one layer of insulating material in accordance with the crown etch mask, creating a third surface area of the at least one layer of insulating material being larger than the second surface area, exposing the second layer of etch stop material;

removing the crown etch mask, the first layer of etch stop material, the layer of pad oxide and the exposed second layer of etch stop material;

creating a layer of capacitor dielectric over the third surface area of the at least one layer of insulating material and extending adjacent thereto; and creating a layer of capacitor material over the surface of the layer of capacitor dielectric material.

10. The method of claim 9, further saliciding the surface of the layer of capacitor material.

11. The method of claim 9 wherein the first layer of etch stop material comprises silicon nitride.

12. The method of claim 9 wherein creating a second layer of etch stop material comprises SiON created by chemical interaction between the nitride implanted into exposed surfaces of the at least one trench and the created layer of liner oxide over the surface thereof.

13. The method of claim 9 wherein the insulation material comprises Shallow Trench Isolation oxide.

14. The method of claim 9 wherein the layer of capacitor dielectric comprises gate oxide.

15. The method of claim 9 wherein the layer of capacitor material comprises polysilicon.

16. A method for the creation of a 1T RAM cell, comprising the steps of:

providing a substrate;

growing a layer of pad oxide over the surface of the substrate;

depositing a first layer of etch stop material over the layer of pad oxide;

etching at least one trench having a first surface are through the first layer of etch stop material, through the layer of pad oxide and into the surface of the substrate;

creating a compound layer over exposed surfaces of the at least one trench, comprising:

(i) growing a layer of liner oxide over exposed surfaces of the at least one trench; and (ii) depositing a layer of silicon nitride over the layer of liner oxide, creating a second layer of etch stop material over exposed surfaces of the at least one trench;

depositing a layer of insulating material over the surface of the first layer of etch stop material, including the surface of the layer of silicon nitride;

planarizing the layer of insulating material to about the surface of the first layer of etch stop material, creating at least one layer of insulating material having a first surface area;

providing a crown etch mask over the surface of the first layer of insulating material, including the surface of the at least one layer of insulating material, exposing the at least one layer of insulating material over a second surface area being smaller than the first surface area;

etching the at least one layer of insulating material in accordance with the crown etch mask, creating a third surface area of the at least one layer of insulating material being larger than the second surface area, exposing the first layer of etch stop material and the compound layer;

removing the crown etch mask, the first layer of etch stop material, the layer of pad oxide and the exposed compound layer;

creating a layer of capacitor dielectric over the third surface area of the at least one layer of insulating material and extending adjacent thereto; and creating a layer of capacitor material over the surface of the layer of capacitor dielectric material.

17. The method of claim 16, further saliciding the surface of the layer of capacitor material.

18. The method of claim 16 wherein the first layer of etch stop material comprises silicon nitride.

19. The method of claim 16 wherein the insulation material comprises Shallow Trench Isolation oxide.

20. The method of claim 16 wherein the layer of capacitor dielectric comprises gate oxide.

21. The method of claim 16 wherein the layer of capacitor material comprises polysilicon.

22. A method for the creation of a damage-free surface of a capacitor in combination with creating a 1T-RAM cell, comprising:

providing a substrate;

creating at least one trench in the surface of the substrate, the trench being surrounded by a layer of pad oxide created over the surface of the substrate and a first layer of etch stop material deposited over the surface of the pad oxide;

creating a second layer of etch stop material over exposed surfaces of the at least one trench by:
(i) performing an $N_2$ impurity implant into exposed surfaces of the at least one trench; and
(ii) growing liner oxide over exposed surfaces of the at least one trench, creating the second layer of etch stop material comprising SiON by chemical interaction between the implanted $N_2$ impurities and the grown liner oxide;

filling the at least one trench with insulating material to a level about equal to the surface of the first layer of etch stop material;

defining capacitor areas by applying a crown etch stopping on the first and second layer of etch stop material, exposing the layer of SiON; and performing additional processing for completion of capacitors in combination with creating a 1T-RAM cell.

23. The method of claim 22, the insulating material comprising Shallow Trench Isolation oxide.

24. The method of claim 22, the filling the at least one trench with insulating material comprising planarizing the layer of insulating material.

25. The method of claim 24, the planarizing comprising methods of Chemical Mechanical Polishing.

26. The method of claim 22, the performing additional processing comprising:

removing the first layer of etch stop material, the layer of pad oxide and the exposed layer of SiON, first exposing the surface of the substrate;

growing a layer of SAC oxide over the first exposed surface of the substrate;

performing p/n-type impurity well implants into the surface of the substrate;

removing the layer SAC oxide, second exposing the surface of the substrate;

growing a layer of gate oxide over the second exposed surface of the substrate;

deposing a layer of gate material over the gate oxide;

patterning and etching the layers of gate material and gate oxide, concurrently creating gate structures overlying gate oxide, upper capacitor plates and layers of capacitor dielectric; and performing processing for completion of gate electrodes and conductive conducts thereto and to the upper capacitor plates.

27. The method of claim 26 wherein the performing processing for completion of gate electrodes and conductive conducts thereto and to the upper capacitor plates comprises steps of salicidation of points of contact to the gate electrodes and the upper capacitor plates.

28. The method of claim 22 wherein the first layer of etch stop material comprises silicon nitride.

29. The method of claim 22 wherein the insulation material comprises Shallow Trench Isolation oxide.

30. The method of claim 26 wherein the layer of capacitor dielectric comprises gate oxide.

31. The method of claim 26 wherein the layer of gate material comprises polysilicon.

32. A method for the creation of a damage-free surface of a capacitor in combination with creating a 1T-RAM cell, comprising:

providing a substrate;

creating at least one trench in the surface of the substrate, the trench being surrounded by a layer of pad oxide created over the surface of the substrate and a first layer of etch stop material deposited over the surface of the pad oxide;

creating a second layer of etch stop material over exposed surfaces of the at least one trench by:
(i) growing liner oxide over exposed surfaces of the at least one trench; and
(ii) depositing a layer of silicon nitride over the liner oxide;

filling the at least one trench with insulating material to a level about equal to the surface of the first layer of etch stop material;

defining capacitor areas by applying a crown etch stopping on the first and second layer of etch stop material, exposing the layer of silicon nitride; and performing additional processing for completion of capacitors in combination with creating a 1T-RAM cell.

33. The method of claim 32, the insulating material comprising Shallow Trench Isolation oxide.

34. The method of claim 32, the filling the at least one trench with insulating material comprising planarizing the layer of insulating material.

35. The method of claim 34, the planarizing comprising methods of Chemical Mechanical Polishing.

36. The method of claim 32, the performing additional processing comprising:

removing the first layer of etch stop material, the layer of pad oxide and the exposed layer of SiON, first exposing the surface of the substrate;

growing a layer of SAC oxide over the first exposed surface of the substrate;

performing p/n-type impurity well implants into the surface of the substrate;

removing the layer SAC oxide, second exposing the surface of the substrate;

growing a layer of gate oxide over the second exposed surface of the substrate;

deposing a layer of gate material over the gate oxide;

patterning and etching the layers of gate material and gate oxide, concurrently creating gate structures overlying gate oxide, upper capacitor plates and layers of capacitor dielectric; and performing processing for completion of gate electrodes and conductive conducts thereto and to the upper capacitor plates.

37. The method of claim 36 wherein the performing processing for completion of gate electrodes and conductive conducts thereto and to the upper capacitor plates comprises steps of salicidation of points of contact to the gate electrodes and the upper capacitor plates.

38. The method of claim 32 wherein the first layer of etch stop material comprises silicon nitride.

39. The method of claim 32 wherein the insulation material comprises Shallow Trench Isolation oxide.

40. The method of claim 36 wherein the layer of capacitor dielectric comprises gate oxide.

41. The method of claim 36 wherein the layer of gate material comprises polysilicon.

42. A structure of damage free capacitors as part of a 1T RAM cell, comprising:

a substrate;

at least one trench having a first surface etched into the surface of the substrate;

a layer of etch stop material formed over surfaces of the at least one trench, the layer of etch stop material comprising:
(i) an $N_2$ impurity implant into exposed surfaces of the at least one trench;
(ii) a layer of liner oxide grown over exposed surfaces of the at least one trench;

the at least one trench having been filled with a layer of insulating material over the surface of the layer of etch stop material, the at least one layer of insulating material having a first surface area;

the at least one layer of insulating material having been etched over a second surface area to a depth, creating a third surface area of the at least one layer of insulating material being larger than the second surface area, exposing the layer of etch stop material, the exposed layer of etch stop material having been removed;

a layer of capacitor dielectric having been created over the third surface area of the at least one layer of insulating material and extending adjacent thereto; and a layer of capacitor material having been created over the surface of the layer of capacitor dielectric material.

43. The structure of claim 42, further comprising salicided surfaces of the layer of capacitor material.

44. The structure of claim 42 wherein the insulation material comprises Shallow Trench Isolation oxide.

45. The structure of claim 42 wherein the layer of capacitor dielectric comprises gate oxide.

46. The structure of claim 42 wherein the layer of capacitor material comprises polysilicon.

47. A structure of damage free capacitors as part of a 1T RAM cell, comprising:

a substrate;

at least one trench having a first surface etched into the surface of the substrate;

a layer of etch stop material formed over surfaces of the at least one trench, the layer of etch stop material comprising:
(i) a layer of liner oxide grown over exposed surfaces of the at least one trench; and
(ii) a layer of silicon nitride deposited over the layer of liner oxide;

the at least one trench having been filled with a layer of insulating material over the surface of the layer of etch stop material, the at least one layer of insulating material having a first surface area;

the at least one layer of insulating material having been etched over a second surface area to a depth, creating a third surface area of the at least one layer of insulating material being larger than the second surface area, exposing the layer of etch stop material, the exposed layer of etch stop material having been removed;

a layer of capacitor dielectric having been created over the third surface area of the at least one layer of insulating material and extending adjacent thereto; and a layer of capacitor material having been created over the surface of the layer of capacitor dielectric material.

48. The structure of claim 47, further comprising salicided surfaces of the layer of capacitor material.

49. The structure of claim 47 wherein the insulation material comprises Shallow Trench Isolation oxide.

50. The structure of claim 47 wherein the layer of capacitor dielectric comprises gate oxide.

51. The structure of claim 47 wherein the layer of capacitor material comprises polysilicon.

52. A structure a damage-free surface of a capacitor in a 1T-RAM cell, comprising:

n/p well surface areas in the surface of the substrate defined by providing n/p-type impurity implants into the surface of a substrate;

cell well surface areas defined in the surface of the substrate by providing impurity implants into the surface of a substrate;

at least one trench created in the surface of the substrate;

a layer of etch stop material, comprising SION, created over exposed surfaces of the at least one trench by first $N_2$ ion implantation into exposed surfaces of the at least one trench and second growing a layer of liner oxide over inside surfaces of said at least one trench;

the at least one trench having been filled with insulating material having a first surface area, the insulating material extending over the at least one trench by a height;

capacitor areas having been defined over the insulating material by patterning and etching the layer of insulating material over a second surface area being smaller than the first surface area to a depth, creating a third surface area of the layer of insulating material above which the layer of insulating material has been removed, the third surface area being larger than the second surface area, exposing the layer of SiON, the exposed layer of SiON having been removed;

a layer of gate oxide having been created over the surface of the substrate;

a layer of gate material having been deposited over the surface of the layer of gate oxide;

the layers of gate oxide and gate material having been patterned and etched, simultaneously creating layers of gate oxide, gate electrode material, capacitor dielectric and upper capacitor plates; and gate electrodes having been completed over the surface of the substrate, including conductive interconnects to the gate electrodes and the upper capacitor plates.

53. The structure of claim 52, the insulating material comprising Shallow Trench Isolation oxide.

54. The structure of claim 52 wherein further the layers of gate electrode material and upper capacitor plates are salicided.

55. The structure of claim 52 wherein the insulation material comprises Shallow Trench Isolation oxide.

56. The structure of claim 52 wherein the layer of gate material comprises polysilicon.

57. A structure a damage-free surface of a capacitor in a 1T-RAM cell, comprising:

n/p well surface areas in the surface of the substrate defined by providing n/p-type impurity implants into the surface of a substrate;

cell well surface areas defined in the surface of the substrate by providing impurity implants into the surface of a substrate;

at least one trench created in the surface of the substrate;

a layer of etch stop material, created over exposed surfaces of the at least one trench by first growing a layer of liner oxide over exposed surface of the at least one trench and second depositing a layer of silicon nitride over inside surfaces of said at least one trench;

the at least one trench having been filled with insulating material having a first surface area, the insulating material extending over the at least one trench by a height;

capacitor areas having been defined over the insulating material by patterning and etching the layer of insulating material over a second surface area being smaller than the first surface area to a depth, creating a third surface area of the layer of insulating material above which the layer of insulating material has been removed, the third surface area being larger than the second surface area, exposing the layer of silicon nitride, the exposed layer of silicon nitride having been removed;

a layer of gate oxide having been created over the surface of the substrate;

a layer of gate material having been deposited over the surface of the layer of gate oxide;

the layers of gate oxide and gate material having been patterned and etched, simultaneously creating layers of gate oxide, gate electrode material, capacitor dielectric and upper capacitor plates; and gate electrodes having been completed over the surface of the substrate, including conductive interconnects to the gate electrodes and the upper capacitor plates.

58. The structure of claim 57, the insulating material comprising Shallow Trench Isolation oxide.

59. The structure of claim 57 wherein further the layers of gate electrode material and upper capacitor plates are salicided.

60. The structure of claim 57 wherein the insulation material comprises Shallow Trench Isolation oxide.

61. The structure of claim 57 wherein the layer of gate material comprises polysilicon.

* * * * *